United States Patent [19]
Riederer et al.

[11] Patent Number: 4,986,272
[45] Date of Patent: Jan. 22, 1991

[54] NMR IMAGING WITH VARIABLE REPETITION

[75] Inventors: Stephen J. Riederer; Farhad Farzaneh, both of Rochester, Minn.

[73] Assignee: Mayo Foundation For Medical Education and Research, Rochester, Minn.

[21] Appl. No.: 391,339

[22] Filed: Aug. 9, 1989

[51] Int. Cl.$^5$ .............................................. A61B 5/055
[52] U.S. Cl. ................................. 128/653 A; 324/309
[58] Field of Search .......................... 128/653, 653.4; 324/309, 311

[56] References Cited

U.S. PATENT DOCUMENTS

| | | | |
|---|---|---|---|
| 4,717,879 | 1/1988 | Riederer et al. | 324/307 |
| 4,734,646 | 3/1988 | Shenoy et al. | 324/309 |
| 4,739,265 | 4/1988 | Yamamoto et al. | 324/309 |
| 4,769,604 | 9/1988 | Sepponen | 324/311 |
| 4,786,872 | 10/1988 | Hoshino | 324/309 |
| 4,814,710 | 3/1989 | McKinnon | 324/309 |
| 4,825,160 | 4/1989 | Kuhn | 324/307 |
| 4,843,321 | 6/1989 | Sotak | 128/653 |
| 4,857,847 | 8/1989 | Machida | 324/311 |

Primary Examiner—Lee S. Cohen
Assistant Examiner—John D. Zele
Attorney, Agent, or Firm—Quarles & Brady

[57] ABSTRACT

An NMR system acquires data by performing a scan using a spin echo pulse sequence. An image is produced from the acquired data using a 2DFT reconstruction method. During the scan the echo time (TE) or the repetition time (TR) is altered as a function of phase encoding value to decrease total scan time or to improve signal-to-noise.

8 Claims, 5 Drawing Sheets

NMR IMAGING WITH VARIABLE REPETITION

BACKGROUND OF THE INVENTION

The field of the invention is nuclear magnetic resonance imaging methods and systems. More particularly, the invention relates to a method for reducing the time required to perform an NMR scan.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence the magnitude of the net transverse magnetic moment $M_1$ depends primarily on the length of time and the magnitude of the applied excitation field $B_1$.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*_2}$$

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a scan made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free induction decay (FID) or, preferably, a spin-echo signal.

The preferred embodiments of the invention will be described in detail with reference to a variant of the well known FT technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751-756 (1980).

Spin-echo imaging using relatively long echo times (TE) is a very effective diagnostic tool. Typically, such sequences have a fixed echo time (TE) of 80 to 100 milliseconds and a scan is comprised of 256 views with one or two averages. The main drawback is the long scanning time, as long as 17 minutes. To reduce total scan time, clinicians often reduce the number of views and accept the consequent reduction in resolution. For example, the scan time can be reduced 25% if the number of views is reduced from 256 to 192, however, the resulting image resolution is also reduced from 256 by 256 to 192 by 256.

The relatively long echo times (TE) are required to provide the desired $T_1$ and $T_2$ weighting in the image. For example, echo times of 80 to 100 milliseconds are preferred for revealing brain pathology, while much shorter echo times of from 15 to 30 milliseconds generally provide $T_1$ weighting and are preferred, for example, when forming images in conjunction with contrast agents. Whatever echo time is selected, the pulse sequence remains fixed during the entire scan to provide a set of data from which an image having the desired $T_1$ and $T_2$ contrast weighting is produced.

SUMMARY OF THE INVENTION

The present invention relates to a method for performing an NMR scan to acquire image data in which the echo time and/or the repetition time are varied during the scan. More specifically, a scan is performed by conducting a series of pulse sequences in which each pulse sequence has a repetition time TR and includes an excitation pulse followed by a phase encoding gradient pulse and followed at a time TE by an NMR signal, and in which the phase encoding gradient pulse is stepped through a set of values to acquire an NMR image data set, and the time TE or the time TR, or both the times TE and TR are varied during the scan to acquire NMR signals in the NMR image data set at a plurality of TE times.

A general object of the invention is to reduce the scan time necessary to acquire an NMR image data set. It has been discovered that if the central views are acquired with a desired TR time, the peripheral views (i.e. high spatial frequency) can be acquired with shorter TR times without significantly changing the diagnostic character of the image. With a shorter TR time for many of the views, the total scan time can be reduced. It has also been discovered that the time TE can be similarly shortened during the acquisition of the peripheral views without significantly changing the diagnostic value of the reconstructed image. This enables a further shortening of the repetition time TR, and hence, the total scan time.

A more specific object of the invention is to weight the contrast differently for different sizes of objects in the reconstructed image. By using longer TE times for the central views and shorter TE times for the peripheral views, the reconstructed image will have $T_1$ and $T_2$ weighted characteristics which are different for large objects than for small objects. This is due to the fact that the central views contribute to the definition of large objects in the reconstructed image, whereas the peripheral views contribute to the definition of small objects and features.

Yet another specific object of the invention is to increase the signal-to-noise ratio of the acquired NMR data. By shortening the echo time TE for peripheral views, the SNR for those views is increased and the SNR for the entire data set is thus increased.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
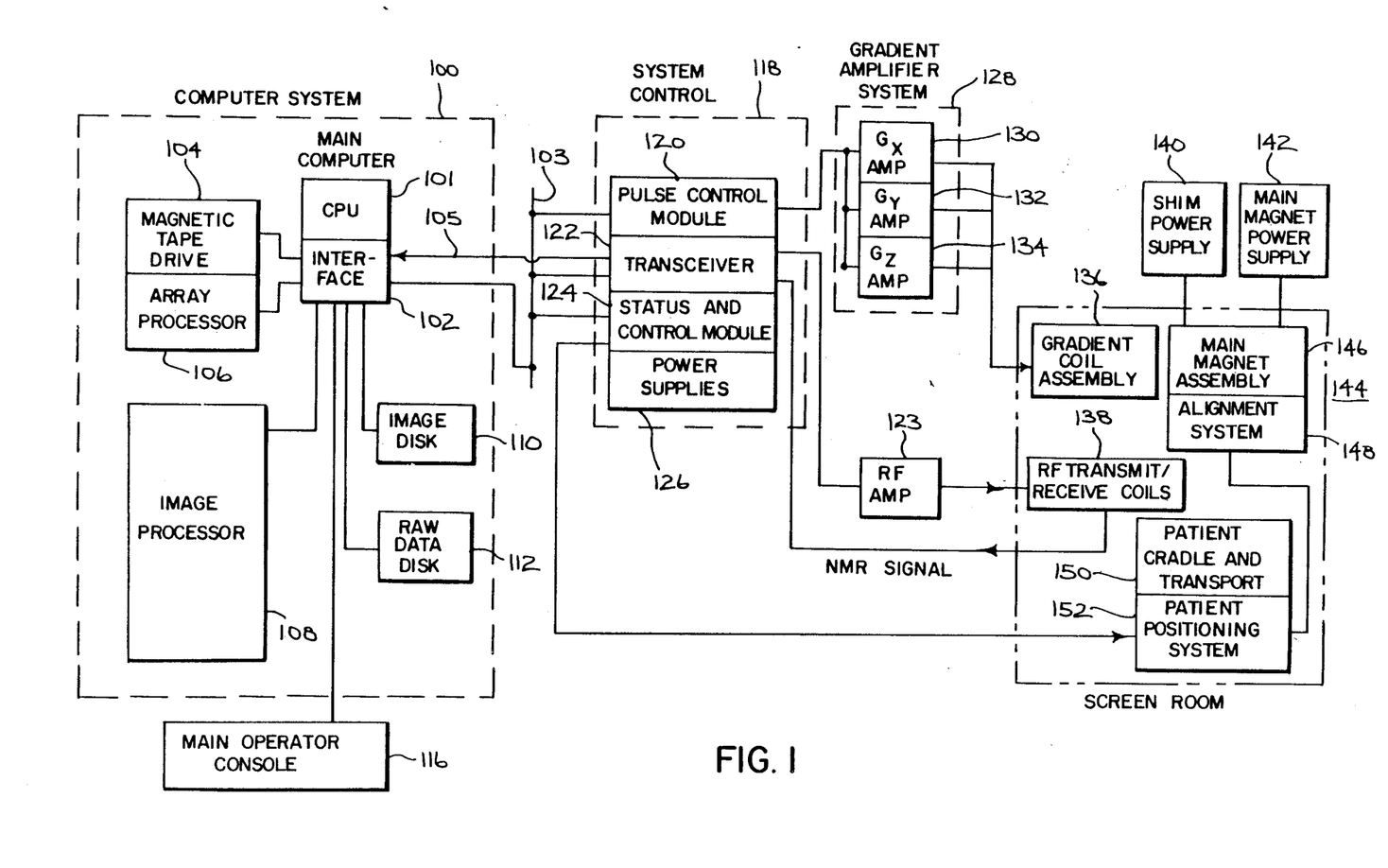
FIG. 1 is a block diagram of an NMR system which employs the present invention.

Referring FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, grayscale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 412 is utilized to bring the polarizing field produced by the magnet to the proper operating strength of 1.5 Tesla and is then disconnected.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
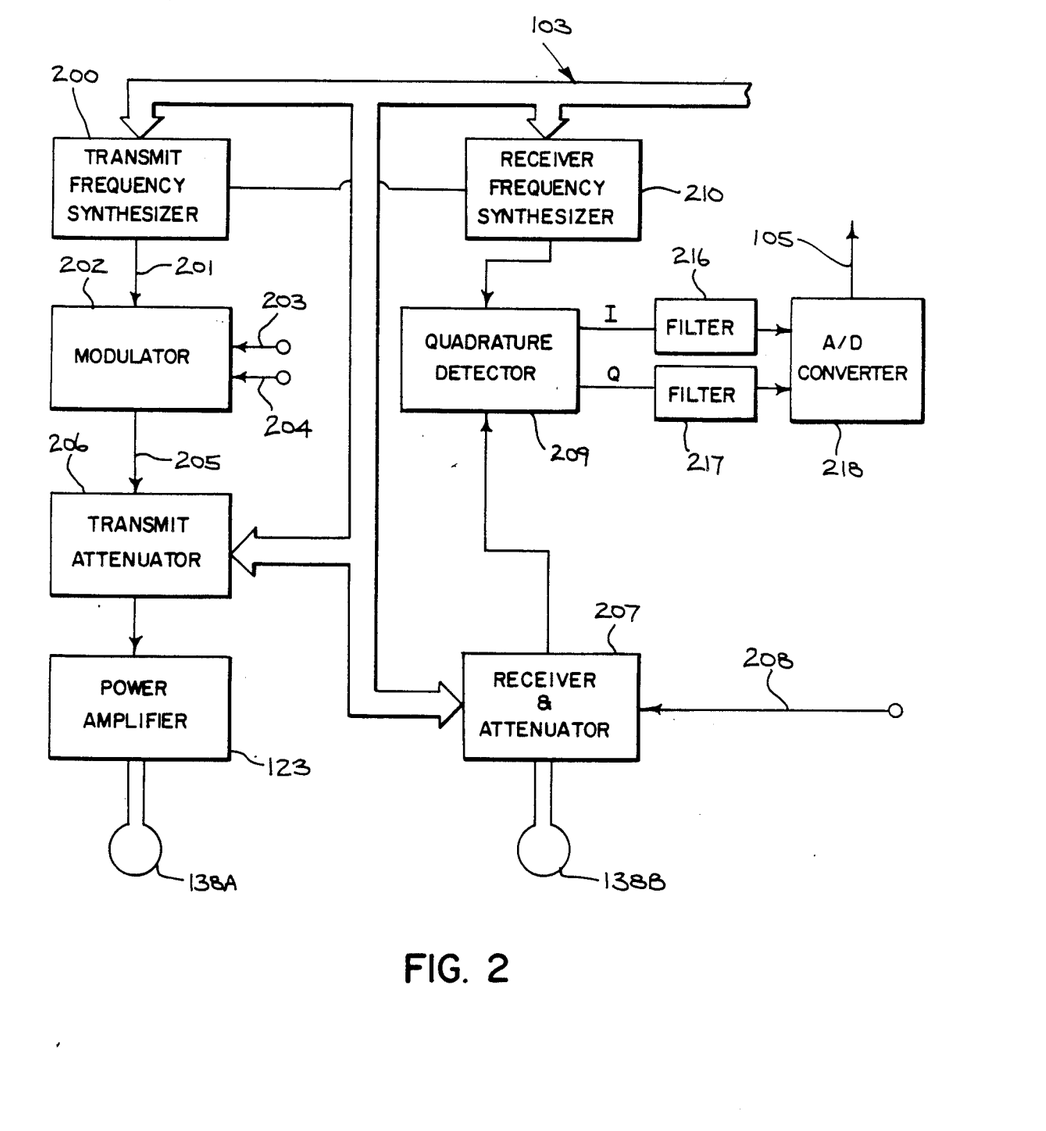
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate of 64 kHz throughout the acquisition period. A set of 256 digital numbers are acquired for each I and Q component of the NMR signal, and these digital numbers are conveyed to the main computer 101 through the serial link 105.

Figure 3:
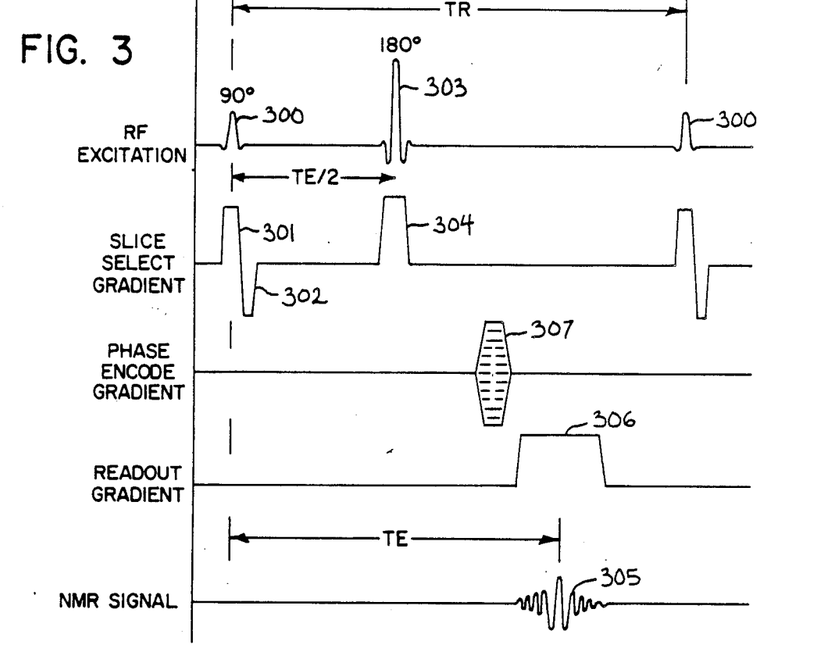
FIG. 3 is a graphic representation of a conventional NMR pulse sequence used to acquire data to produce an image.

The NMR system of FIG. 1 performs a series of pulse sequences to collect sufficient NMR data to reconstruct an image. One such pulse sequence is shown in FIG. 3. This sequence performs a slice selection by applying a 90° selective RF excitation pulse 300 in the presence of a z axis gradient pulse 301 and its associated rephasing pulse 302. After an interval TE/2, a 180° selective RF excitation pulse 303 is applied in the presence of another z axis gradient pulse 304 to refocus the transverse magnetization at the echo time TE and produce an echo NMR signal 305.

To position encode the echo NMR signal 305, an x axis read-out gradient pulse 306 is applied during the acquisition of the NMR signal 305. The read-out gradient frequency encodes the NMR signal 305 in the well known manner. In addition, the echo NMR signal 305 is position encoded along the y axis by a phase encoding gradient pulse 307. The phase encoding gradient pulse 307 has one strength during each echo pulse sequence and associated NMR echo signal 305, and it is typically incremented in steps through 256 discrete strengths (−128 to +128) during the entire scan. As a result, each of the 256 NMR echo signals 305 acquired during the scan is uniquely phase encoded.

It is, of course, usual practice to repeat the pulse sequence for each phase encoding gradient value one or more times and to combine the acquired NMR signals in some manner to improve signal-to-noise and to offset irregularities in the magnetic fields. In the following discussion, it is assumed that such techniques may be used. Also, while an RF referenced spin echo signal is produced in the pulse sequence of FIG. 3, it is also possible to practice the present invention using a pulse sequence that produces a gradient-recalled echo signal.

Figure 4:
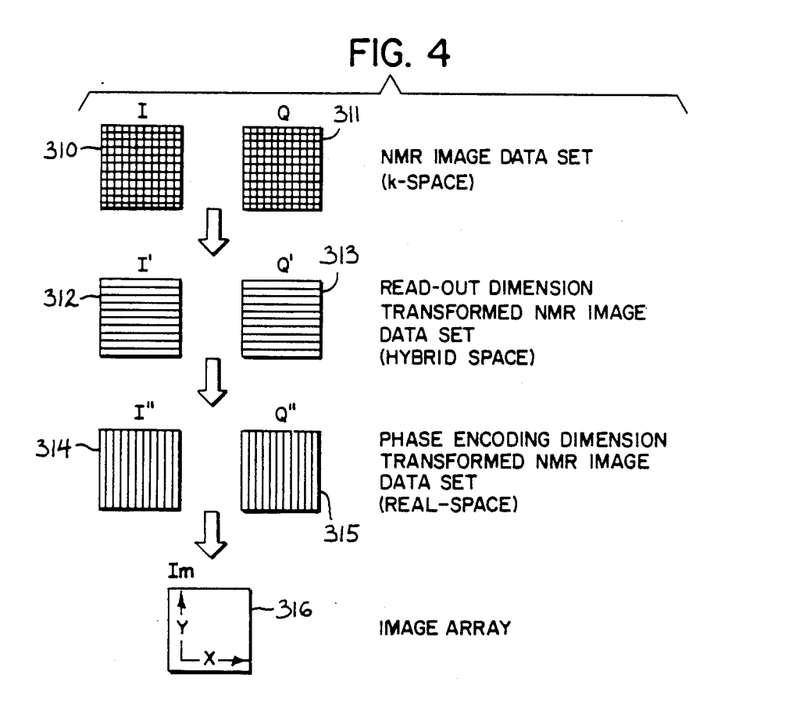
FIG. 4 is a pictorial representation of how an image is reconstructed from the NMR data acquired using the pulse sequence of FIG. 3.

Referring particularly to FIG. 4, the acquired NMR data is stored in the data disk 112 (FIG. 1) in the form of two 256X256 element arrays 310 and 311. The array 310 contains the in-phase magnitude values I and the array 311 contains the quadrature values Q. Together these arrays 310 and 311 form an NMR image data set which defines the acquired image in what is referred to in the art as "k-space".

To convert this k-space NMR data set into data which defines the image in real space (i.e. Cartesian coordinates), a two step Fourier transformation is performed on the I and Q arrays 310 and 311. The transformation is performed first in the read-out direction which is the horizontal rows of the arrays 310 and 311 to produce two 256X256 element arrays 312 and 313. The array 312 contains the in-phase data and is labeled I', while the array 313 contains the quadrature data and is labeled Q'. The I' and Q' arrays 312 and 313 define the acquired image in what is referred to in the art as "hybrid-space". This first transformation of the acquired NMR data set is expressed mathematically as follows:

$$S_{xy}(k\text{-space}) \rightarrow S_{x'y}(\text{hybrid-space}) \quad (1)$$

$$S_{x'y} = \frac{1}{256} \sum_{x=0}^{255} S_{xy} e^{-i2\pi xx'/256}$$

The second transformation is performed in the phase encoding direction which is the vertical columns of the arrays 312 and 313 to produce two 256X256 element arrays 314 and 315. The array 314 contains the transformed in-phase values and is labeled I'', while the array 315 contains the quadrature values and is labeled Q''. This second transformation may be expressed mathematically as follows:

$$S_{x'y}(\text{hybrid-space}) \rightarrow S_{x'y'}(\text{real space}) \quad (2)$$

$$S_{x'y'} = \frac{1}{256} \sum_{y=0}^{255} S_{x'y} e^{-i2\pi yy'/256}$$

The arrays 314 and 315 are a data set which defines the acquired image in real space and the elements thereof are used to calculate the intensity values in a 256X256 element image array 316 in accordance with the following expression:

$$Im_{xy} = \sqrt{(I''_{xy})^2 + (Q''_{xy})^2} \quad (3)$$

The 256X256 elements of the image array 316 are mapped to the main operator console 116 (FIG. 1) for display on a CRT screen.

The above described NMR system and pulse sequence produces an image in which the contrast may be determined by spin density alone or it may be enhanced by $T_1$ or $T_2$ effects. For example, cerebrospinal fluid (CSF) exhibits a considerably longer $T_1$ and $T_2$ than brain tissue, and these differences can be exploited to produce different contrast effects in the reconstructed image. If TE is short, brain tissue appears brighter than CSF, and if TE is set to a larger value, CSF appears brighter than brain tissue. A range of contrast effects can be achieved by selecting an echo time TE intermediate these two extremes.

Figure 5A:
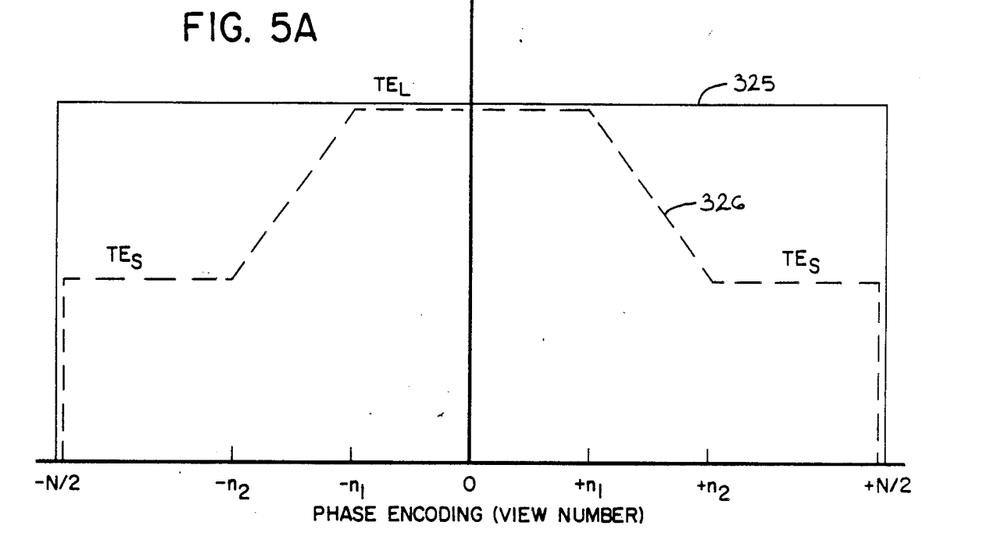
FIGS. 5A and 5B are graphic representations of the manner in which echo time TE and repetition time TR may be varied throughout a scan.

In prior NMR systems the desired echo time is fixed at the beginning of the scan to achieve the desired contrast enhancement and the entire scan is conducted with this fixed echo time. This is illustrated graphically in FIG. 5 where the echo time TE is plotted as a function of view number. As shown by line 325, for all views, or phase encoding values ($k_y$), ranging from $-N/2$, through 0 to $+N/2$, the echo time TE remains fixed at a constant value $TE_L$. In contrast, it is the teaching of the present invention that the echo time TE can be varied as a function of view number.

One such variation in echo time TE as a function of view number is shown in FIG. 5A by dotted line 326. In this preferred embodiment of the invention the echo time TE is maintained at the longer time period $TE_L$ for the central views of the scan ($-n_1$ through $+n_1$). Over a range of peripheral views ($-n_2$ through $-N/2$ and $+n_2$ through $+N/2$) the short echo time $TE_S$ is maintained at a constant value.

Referring particularly to FIG. 3, the echo time TE is varied by controlling the timing between the 90° RF excitation pulse 300 and the 180° RF excitation pulse 303. This timing is determined by the pulse control module 120 (FIG. 1) which generates command signals over the link 103 to the transceiver 122 as explained above. Of course, when the time TE/2 is changed, the timing of the slice select pulse 304 must also be changed and the timing of the readout gradient pulse 306 must be changed to maintain its symmetry about the center of the echo NMR signal 305.

In the preferred embodiment 256 views are acquired (N/2=128). The central views have a long echo time $TE_L$ of 80 milliseconds and a short echo time $TE_S$ of 20 milliseconds. The central region where the echo time $TE_L$ is employed ranges from $-n_1=-20$ to $+n_1=20$. The peripheral regions where the short echo time $TE_S$ is employed begins at $n_2=60$. The echo time TE diminishes linearly in the transition regions ($n_1$ through $n_2$).

The image which is reconstructed from NMR data acquired with the variable echo time TE of FIG. 5A is not reduced in diagnostic value. The image tends to have an increase in edge definition compared to that of an image acquired with a constant echo time $TE_L$. Likewise, small objects tend to look somewhat more intense because the higher spatial frequencies are emphasized. This emphasis is caused by the shorter TE which produces an echo signal that has undergone less $T_2$ decay. This same increase in echo signal strength also results in an improved signal-to-noise ratio which improves image quality.

Figure 5B:
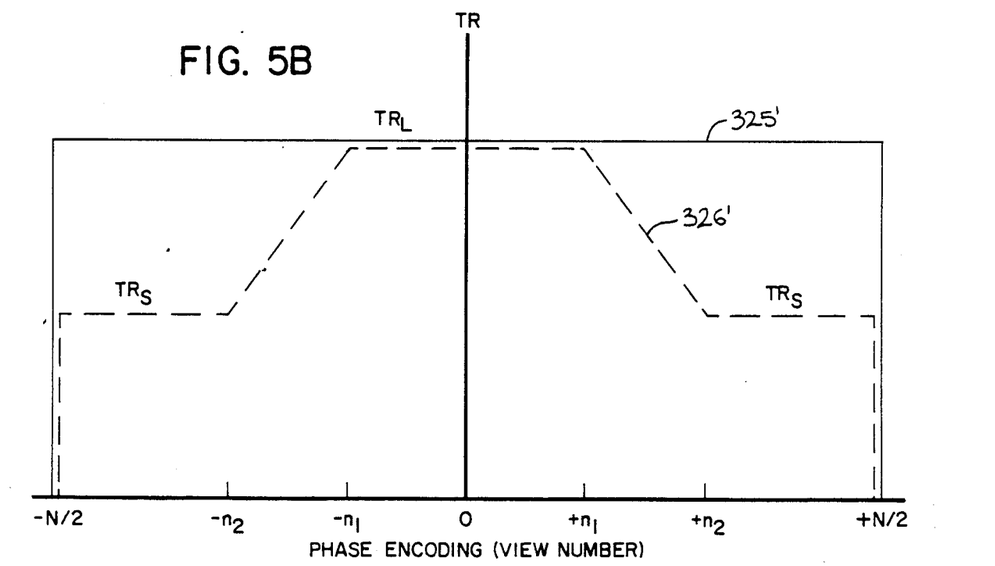

Another aspect of the invention is to employ a variable repetition time TR during the scan. This is illustrated in FIG. 5B where solid line 325' indicates a normal scan with constant repetition time $TR_L$ for all views, and dashed line 326' illustrates a preferred embodiment of the invention in which repetition time is shortened to $TR_S$ for the peripheral views. The break points $\pm n_1$ and $\pm n_2$ in this scan are the same as those described above for FIG. 5A.

When the variable repetition time is employed in an NMR scan, the total scan time is directly reduced. The scan time is given by $$T_S = TR \cdot N \cdot NEX$$

where:
TR = Pulse repetition time which is longer than TE and is usually much longer to reduce $T_1$ effects;
N = number of views; and
NEX = number of repetitions of each view.
In the preferred embodiment, a reduction of 30% is achieved in total scan time.

Figure 6A:
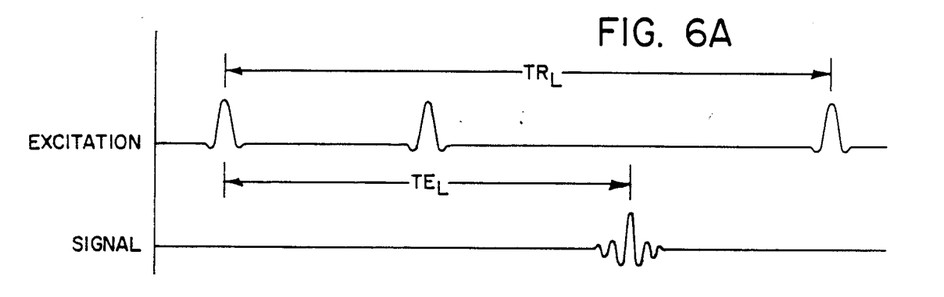
FIGS. 6A-6D are graphic representations showing how the pulse sequence of FIG. 3 can be changed by shortening TE, TR or both.
Figure 6B:
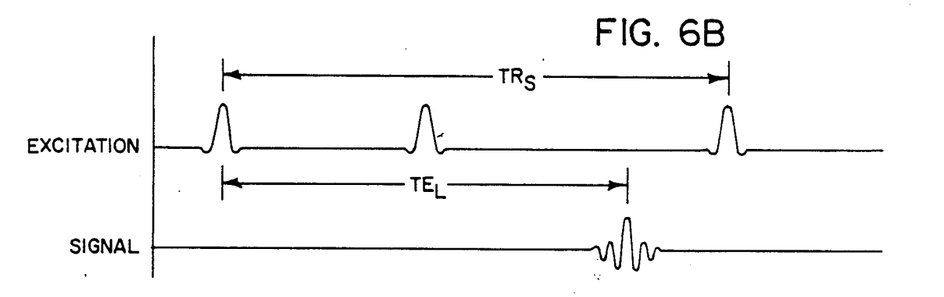
Figure 6C:
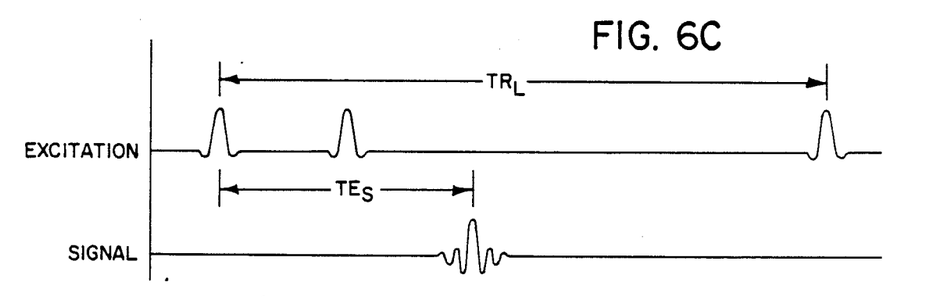
Figure 6D:
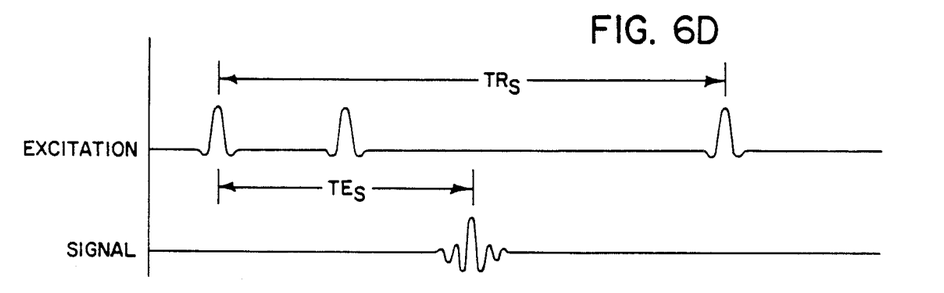

It should be apparent to those skilled in the art that performance may be improved by employing either variable echo times TE, or variable repetition times TR, or both. This is illustrated in FIGS. 6A through 6D, where FIG. 6A illustrates a pulse sequence in which both times are at their maximum values $TE_L$ and $TR_L$. FIG. 6B shows a pulse sequence in which the repetition time is shortened to $TR_S$ to reduce total scan time, and FIG. 6C shows a pulse sequence in which echo time is shortened to $TE_S$ to improve signal-to-noise. FIG. 6D shows a pulse sequence in which both times have been shortened to $TE_S$ and $TR_S$.

We claim:

1. In a method for producing a set of NMR image data that is acquired by repeating a pulse sequence in which an NMR echo signal is acquired following the application of a first RF excitation pulse, and in which a phase encoding gradient pulse is produced in each pulse sequence and is stepped through a set of discrete values as the pulse sequence is repeated, the improvement therein comprising;

altering the pulse sequence as the NMR data set is acquired by changing the time interval therein between the application of the first RF excitation pulse and the acquisition of the NMR echo signal as a varying function of the phase encoding gradient pulse value.

2. The improvement as recited in claim 1 in which the NMR echo signal is a spin echo produced by a second RF excitation pulse in each pulse sequence, and the time interval between the NMR echo signal and the first RF excitation pulse is changed by altering the time interval between said first and second RF excitation pulses.

3. The improvement as recited in claim 1 in which the phase encoding gradient pulse is stepped through values ranging from a maximum negative value $(-N/2)$, through a minimum magnitude value and to a maximum position value $(+N/2)$, and the time interval is changed such that it has a maximum value when the phase encoding gradient is at its minimum magnitude value and the time interval has a minimum value when the phase encoding gradient is at its maximum values.

4. The improvement as recited in claim 3 in which the time interval is at its maximum value for a set of phase encoding gradient pulse values centered around the minimum magnitude value of the phase encoding gradient pulse.

5. The improvement as recited in claim 1 in which the rate at which the pulse sequence is repeated is changed as the set of NMR data is acquired.

6. In a method for producing a set of NMR image data that is acquired by repeating a pulse sequence in which an NMR signal is acquired following the application of a first RF excitation pulse, and in which a phase encoding gradient pulse is produced, in each pulse sequence and is stepped through a set of discrete values as the pulse sequence is repeated, the improvement therein comprising;

altering the pulse sequence as the NMR data set is acquired by changing the time interval between the repetition of the pulse sequence as a varying function of the phase encoding gradient pulse value.

7. The improvement as recited in claim 6 in which the phase encoding gradient pulse is stepped through values ranging from a maximum negative value $(-N/2)$, through a minimum magnitude value and to a maximum position value $(+N/2)$, and the time interval is changed such that it has a maximum value when the phase encoding gradient is at its minimum and it has a minimum value when the phase encoding gradient is at its maximum.

8. The improvement as recited in claim 7 in which the time interval is at its maximum value for a set of phase encoding gradient pulse values centered around the minimum magnitude value of the phase encoding gradient pulse.

* * * * *

UNITED STATES PATENT AND TRADEMARK OFFICE
CERTIFICATE OF CORRECTION

PATENT NO. : 4,986,272

DATED : January 22, 1991

INVENTOR(S) : Stephen J. Riederer and Farhad Farzaneh

It is certified that error appears in the above-identified patent and that said Letters Patent is hereby corrected as shown below:

On the title page, item [54] and in column 1, line 1:
Title "NMR IMGAGING WITH VARIABLE REPITION"
    should read --NMR IMAGING WITH VARIABLE REPITION ECHO TIMES--;

Col. 4, line 4 "Referring Fig. 1"
    should read --Referring to Fig. 1--;

Col. 8, line 58 "by $T_S = TR.N.NEX.$"
    should read --by: $T_S = TR \cdot N \cdot NEX$--;

Col. 10, line 31 "minimum and it"
    should read --minimum magnitude value and the time interval--;

Col. 10, line 33 "maximum"
    should read --maximum values--.

Signed and Sealed this

Twenty-eighth Day of July, 1992

*Attest:*

DOUGLAS B. COMER

*Attesting Officer*     *Acting Commissioner of Patents and Trademarks*

UNITED STATES PATENT AND TRADEMARK OFFICE
CERTIFICATE OF CORRECTION

Patent No.    : 4,986,272
Dated         : January 22, 1991
Inventor(s)   : S.J. Riederer, et al.

It is certified that error appears in the above-identified patent and that said Letters Patent is hereby corrected as shown below:

Column 1, line 3, insert the following:

--This invention was made with U.S. Government support awarded by the National Institutes of Health (NIH) Grant No.: CA 37993-05. The U.S. Government has certain rights in this invention.--

Signed and Sealed this

Twelfth Day of August, 1997

*Attest:*

BRUCE LEHMAN

*Attesting Officer*    Commissioner of Patents and Trademarks